(12) United States Patent
Park

(10) Patent No.: US 8,422,282 B2
(45) Date of Patent: Apr. 16, 2013

(54) PHASE CHANGE MEMORY APPARATUS HAVING ROW CONTROL CELL

(75) Inventor: Kyoung Wook Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 236 days.

(21) Appl. No.: 12/983,097

(22) Filed: Dec. 31, 2010

(65) Prior Publication Data
US 2012/0081954 A1     Apr. 5, 2012

(30) Foreign Application Priority Data
Sep. 30, 2010 (KR) .................. 10-2010-0095638

(51) Int. Cl.
*G11C 11/00* (2006.01)
(52) U.S. Cl.
USPC .. 365/163; 365/148; 365/185.13; 365/185.05
(58) Field of Classification Search .................. 365/163, 365/148, 185.05; 354/185.13
See application file for complete search history.

(56) References Cited

U.S. PATENT DOCUMENTS

| 2006/0215440 A1 | 9/2006 | Cho et al. |
| 2009/0161416 A1 | 6/2009 | Lamorey |
| 2010/0008132 A1 | 1/2010 | Hwang et al. |
| 2010/0128516 A1 | 5/2010 | Cho et al. |

FOREIGN PATENT DOCUMENTS

| JP | 01-237996 | 9/1989 |
| KR | 1020090097723 A | 9/2009 |
| KR | 1020100052312 A | 5/2010 |
| KR | 1020100057363 A | 5/2010 |
| KR | 1020110001409 A | 1/2011 |

*Primary Examiner* — Tuan T. Nguyen
(74) *Attorney, Agent, or Firm* — William Park & Associates Ltd.

(57) ABSTRACT

A semiconductor integrated circuit includes a phase change memory apparatus includes a plurality of row control cells and a plurality of phase change memory cells formed on the row control cells while being electrically connected to the row control cells. The plurality of row control cells and the plurality of phase change memory cells are vertically stacked in a cell array area.

16 Claims, 3 Drawing Sheets

PHASE CHANGE MEMORY APPARATUS HAVING ROW CONTROL CELL

CROSS-REFERENCES TO RELATED APPLICATION

The present application claims priority under 35 U.S.C. §119(a) to Korean application number 10-2010-0095638, filed on Sep. 30, 2010, in the Korean Intellectual Property Office, which is incorporated herein by reference in its entirety as set forth in full.

BACKGROUND

1. Technical Field

The present invention relates to a phase change memory apparatus, and more particularly, to a cell array structure of a phase change memory apparatus in which a row control cell serving as a local switch is embedded in a cell array area.

2. Related Art

Non-volatile memory apparatuses have characteristics that data stored therein is not lost even when power is interrupted. Accordingly, the non-volatile memory apparatuses are being extensively used for computers, mobile telecommunication systems, memory cards and the like.

A flash memory has been extensively used as a representative non-volatile memory apparatus. Besides, many types of non-volatile memory apparatus have been researched.

At the present time, as new non-volatile memory apparatuses capable of substituting for a flash memory, phase change memory apparatuses having random access characteristics of a DRAM are being actively developed.

According to a known art, a phase change memory apparatus includes a plurality of word lines, a plurality of bit lines crossing the plurality of word lines, and phase change memory cells arranged at the intersection points of the word lines and the bit lines.

The phase change memory cell may include a switching element coupled to a word line and a resistor coupled between the switching element and a bit line. The resistor may be formed of a phase change material of which a phase state is changeable depending on the temperature.

According to the known art, a first and second local switch units are installed at a side of the word line and a side of the bit line to select the word line and the bit line, respectively. The first local switch unit may include a MOS transistor coupled to the word line to respond a global address signal and a local address signal, and the second local switch unit may include the MOS transistor coupled to the bit line. The first and second local switch units may be arranged at a peripheral portion of a cell array.

Similarly to other memory apparatuses, there is a demand for a phase change memory apparatus with the high integration degree.

In this regard, various attempts are being made to reduce the cell area. For example, a diode of which a size is relatively smaller than that of a MOS transistor may be used as a switching element.

SUMMARY

In an exemplary embodiment of the present invention, a phase change memory apparatus includes a plurality of row control cells, and a plurality of phase change memory cells formed on the row control cells while being electrically connected to the row control cells, wherein the plurality of row control cells and the plurality of phase change memory cells are vertically stacked in a cell array area.

In another exemplary embodiment of the present invention, a phase change memory apparatus includes a global word line formed across a cell array area, a plurality of word lines configured to be controlled by the global word line, a plurality of row control cells coupled between the plurality of word lines and the global word line, wherein the plurality of row control cells are configured to control driving of the word lines, and a plurality of phase change memory cells coupled to the plurality of word lines, respectively, wherein the row control cells and the phase change memory cells are vertically stacked in the cell array area.

In further another exemplary embodiment of the present invention, a phase change memory apparatus includes a semiconductor substrate including a cell array area, and a row control cell formed on the cell array area. Here, the row control cell includes a first transistor configured to transfer a signal of a word line in response to a signal of a global word line, and a second transistor configured to transfer the signal, which is received from the first transistor, to a ground line in response to a signal of a first local word line.

BRIEF DESCRIPTION OF THE DRAWINGS

Features, aspects, and embodiments are described in conjunction with the attached drawings, in which.

DETAILED DESCRIPTION

Figure 1:
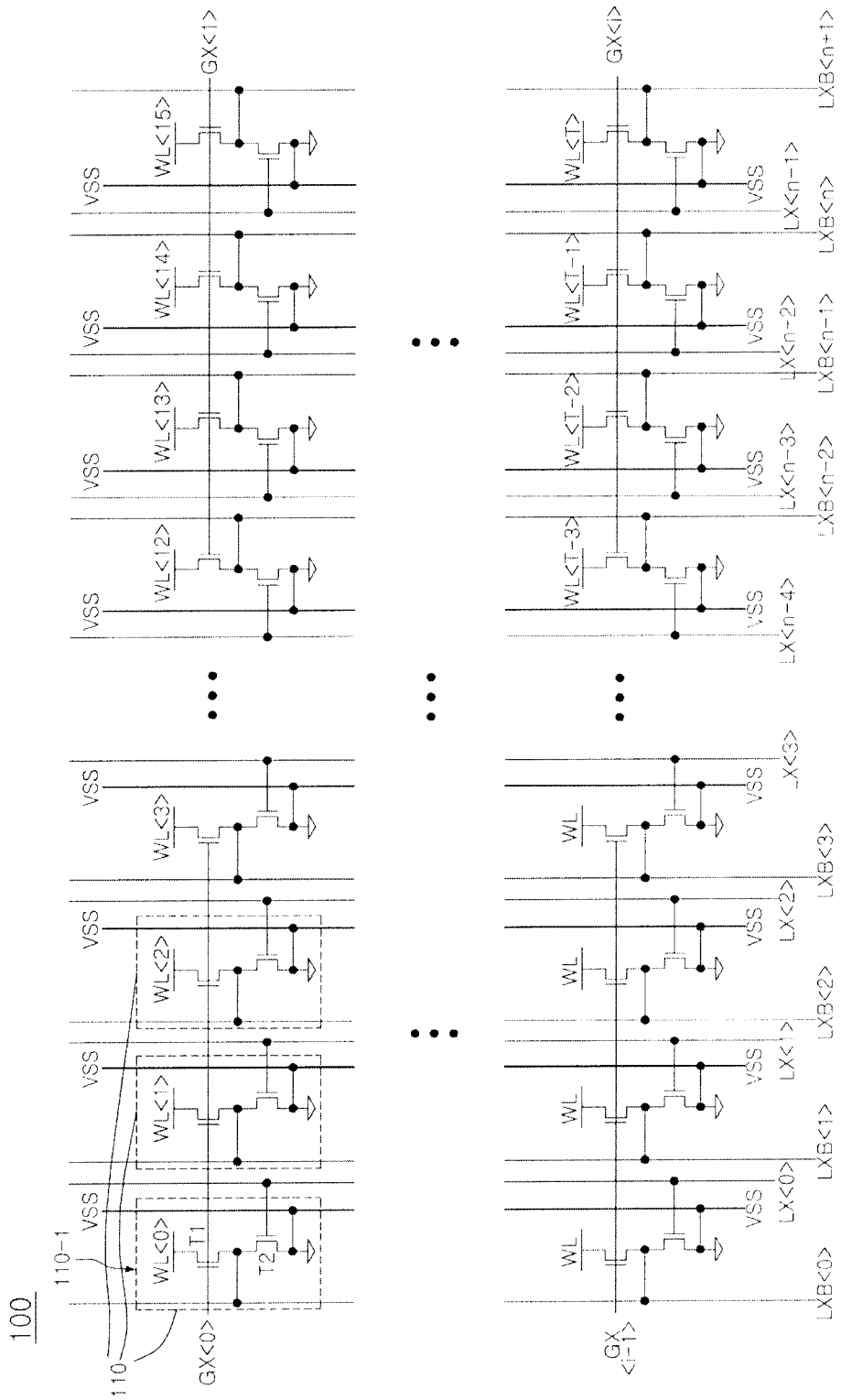
FIG. 1 is a schematic circuit diagram illustrating an inside of a cell array of a phase change memory apparatus according to an exemplary embodiment of the invention.

Hereinafter, a phase change memory apparatus according to the present invention will be described below with reference to the accompanying drawings through exemplary embodiments.

The scope of the invention is not limited to embodiments to be described below and the invention may be realized in various forms. The embodiments are nothing but the ones provided to bring the disclosure of the invention to perfection and assist those skilled in the art to completely understand the present invention. In addition, the same reference numerals are used to designate the same elements throughout the drawings.

When one element is referred to as being "connected to" or "coupled to" another element, it can be directly connected or coupled to another element or intervening elements may also be present. Furthermore, when one element is referred to as being "directly connected to" or "directly coupled to" another element, intervening elements may not be present.

FIG. 1 is a schematic circuit diagram illustrating an inside of a cell array of a phase change memory apparatus according to an exemplary embodiment of the invention, which illustrates a structure before a switching diode and a resistor constituting a unit cell of the phase change memory apparatus are formed.

Referring to FIG. 1, the phase change memory apparatus of the exemplary embodiment includes a plurality of row control cells 110. The plurality of row control cells 110 may be arranged on the cell array area 100 in a matrix form. In the exemplary embodiment, the row control cells 110 indicate cells for controlling row lines (that is, word lines) of the phase change memory apparatus. The cell array area 100, where the row control cells 110 are formed, is an area where a memory cell array is to be formed. According to an exemplary embodiment of the invention, the row control cells 110 are formed under the memory cell array. Although the row control cells 110 are arranged in the matrix form as described above, the row control cells 110 may not correspond to the phase change memory cells in a one-to-one manner and may have a unit area different from an area of the phase change memory cells.

In the cell array area 100, a plurality of global word lines GX<0:i>, a plurality of first local word lines LX<0:n>, a plurality of second local word lines LXB<0:n+1>, a ground line Vss, a plurality of word lines WL<0:T>, and the plurality of row control cells 110 are arranged.

In the plurality of global word lines GX<0:i>, the global word lines in odd numbers and the global word lines in even numbers may be arranged while being spaced from each other. For example, the global word lines GX<1,3,5 . . . > in odd numbers may be arranged at the right side of FIG. 1 at the same interval while being parallel to one another, and the global word lines GX<0,2,4,6 . . . > in even numbers may be arranged at the left side of FIG. 1 at the same interval while being parallel to one another. The global word lines GX<1,3,5 . . . > in odd numbers may be arranged to correspond to the global word lines GX<0,2,4,6 . . . > in even numbers, respectively.

According to an example, the plurality of first local word lines LX<0:n> are formed along a direction perpendicular to the global word lines GX<0:i> and in parallel to one another while being spaced apart from one another at a certain interval.

The plurality of second local word lines LXB<0:n+1> also are formed along the direction perpendicular to the global word lines GX<0:i> and in parallel to one another while being spaced apart from one another at a certain interval.

The first local word lines LX<0:n> and the second local word lines LXB<0:n+1> may be alternately arranged to transfer signal values inverted relative to one another. The first local word line LX<a> and the second local word line LXB<a+1> may be arranged adjacent to each other while forming a pair. Furthermore, the first and second local word lines LX<a> and LXB<a> of the same ordinal number may be arranged while being spaced apart from each other at a certain interval.

The ground line Vss may be arranged in parallel to the first local word lines LX<0:n> and the second local word lines LXB<0:n+1>.

The plurality of row control cells 110 may be coupled between the first local word lines LX<0:n> and the second local word lines LXB<0:n+1>, respectively. Since the respective row control cells 110 have the same structure although the orders of input/output signal lines are different, a first row control cell 110-1 will be described as an example.

The first row control cell 110-1 includes a first transistor T1 and a second transistor T2. The first transistor T1 switches the voltage of a corresponding word line WL<0> in response to a corresponding global word line GX<0>, and the second transistor T2 discharges the drain signal (the output voltage) of the first transistor T1 to the ground line Vss in response to a corresponding first local word line LX<0>.

In more detail, the first transistor T1 includes a gate coupled to the corresponding global word line GX<0>, a drain coupled to the corresponding word line WL<0>, and a source coupled to the corresponding second local word line LXB<0>. The second transistor T2 includes a gate coupled to the corresponding first local word line LX<0>, a drain coupled to the source of the first transistor T1, and a source coupled to the ground line Vss. The second local word line LXB<0> may precharge the row control cell 110 when no global word line is selected.

In the phase change memory apparatus according to the exemplary embodiment as described above, a plurality of row control cells 110 coupled to the word lines WL<0:T> are coupled to a global word line when viewed on the basis of the global word lines GX<0:i>. Also, a plurality of row control cells 110 coupled to the plurality of global word lines GX<0:i> are coupled to one first local word line.

Then, phase change memory cells including general switching elements and resistors are formed the row control cells 110, in the cell array area 100.

In the phase change memory apparatus according to the exemplary embodiment as described above, area efficiency may be improved by stacking low control cells and phase change memory cells. Further, since corresponding global word lines and local word lines are driven at the same time when a word line is driven, voltage distribution is performed among respective lines, and thus a current on the word line may be distributed.

Figure 2:
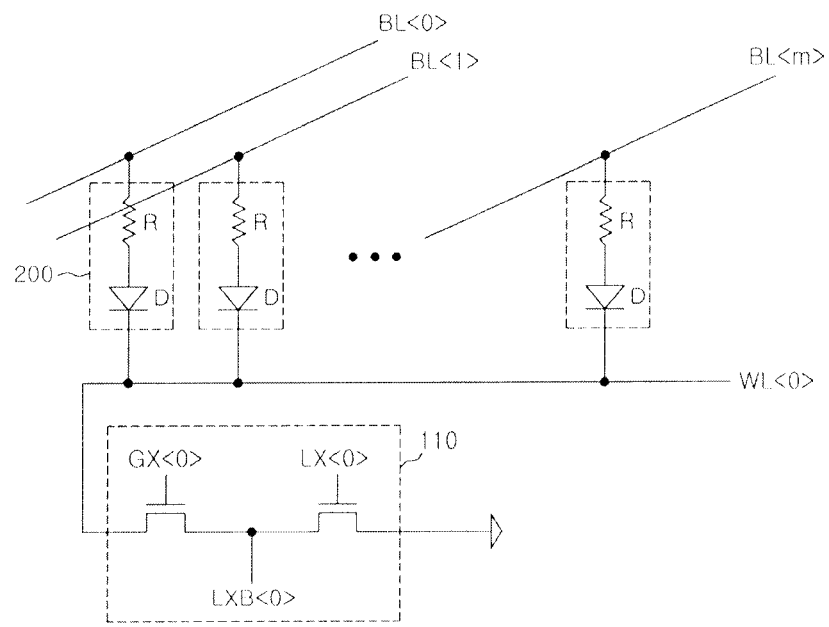
FIG. 2 is a circuit diagram three-dimensionally illustrating an equivalent circuit when viewed from a word line of a phase change memory apparatus according to an exemplary embodiment of the invention.

FIG. 2 is a circuit diagram three-dimensionally illustrating an equivalent circuit when viewed from the word line of the phase change memory apparatus according to the exemplary embodiment of the invention.

Referring to FIG. 2, for example, a plurality of bit lines BL<0:m> are arranged above a first word line WL<0> while being perpendicular to the first word line WL<0>.

Phase change memory cells 200 are formed at the intersection points of the first word line WL<0> and the plurality of bit lines BL<0:m>. Each phase change memory cell 200 includes a switching element D and a resistor R coupled to the switching element D. For example, the switching element D may include a vertical-type diode, and the resistor R may include a phase change material.

The row control cell 110 including the first transistor T1 and the second transistor T2 is coupled to the first word line WL<0>. Here, the row control cell 110 is electrically connected to the first word line WL<0> and arranged below the phase change memory cell 200. Consequently, the row control cell 110 may be formed to have a sufficient area in the cell array area.

Figure 3:
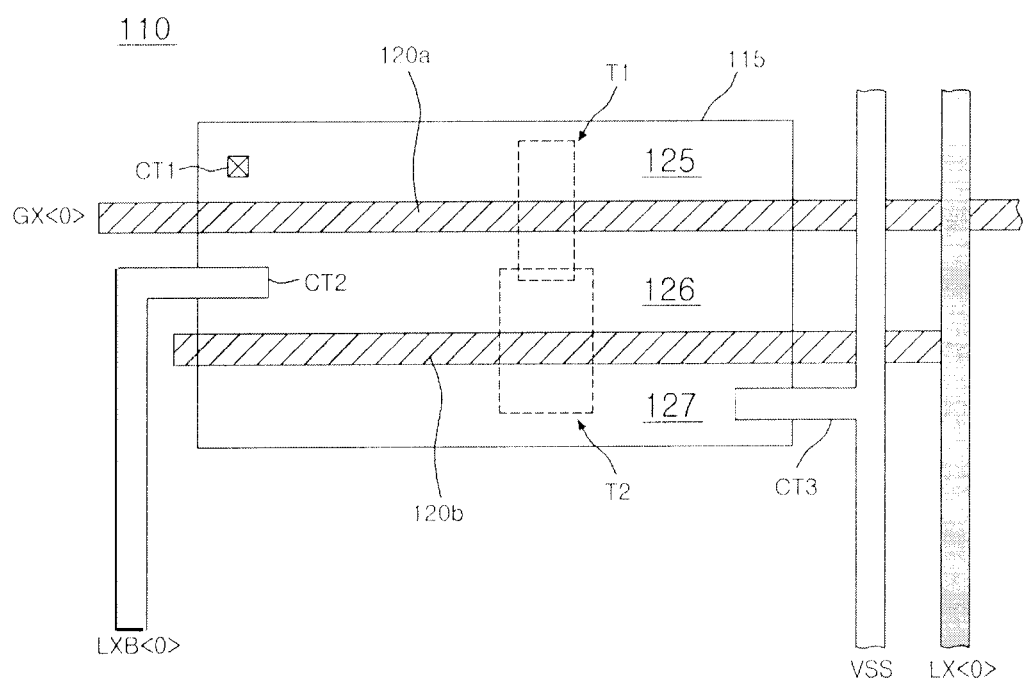
FIG. 3 is a layout view of a row control cell according to an exemplary embodiment of the invention.

FIG. 3 is a layout view of a row control cell according to the exemplary embodiment of the invention.

Referring to FIG. 3, an active area 115 for a row control cell is formed on an area assigned to the cell array area 100. A first gate electrode 120a and a second gate electrode 120b are formed on the active area 115, for example, in parallel to each other. The first gate electrode 120a, for example, may be the first global word line GX<0>, and the second gate electrode 120b is coupled to the first local word line LX<0> which will be described later.

Drains and sources 125, 126 and 127 are formed at both sides of the first and second gate electrodes 120a and 120b to form the first transistor T1 and the second transistor T2.

Although not shown in FIG. 3, the drain 125 of the first transistor T1 makes electrical contact (CT1) with the word line WL. The common junction region 126, which is a source of the first transistor T1 and corresponds to a drain of the second transistor T2, is electrically connected to the second local word line LXB<0> through a contact CT2. The source 127 of the second transistor T2 is electrically connected to the ground line Vss through a contact CT3.

Here, the first local word line LX<0>, the second local word line LXB<0> and the ground line Vss may be arranged to be substantially perpendicular to the global word line 120a (GX<0>). Specifically, the first local word line LX<0> and the second local word line LXB<0> of the same ordinal number may be arranged to face each other.

Since the row control cell 110 as described above is assigned to an area where a word line is arranged, the row control cell 110 may be designed to have a large feature size, resulting in the achievement of high performance. Furthermore, in the state where the row control cell 110 is completed as described above, an insulation layer is formed, and then the phase change memory cells are stacked on the insulation layer. Therefore, no electrical problems occur between the phase change memory cell and the row control cell.

Figure 4:
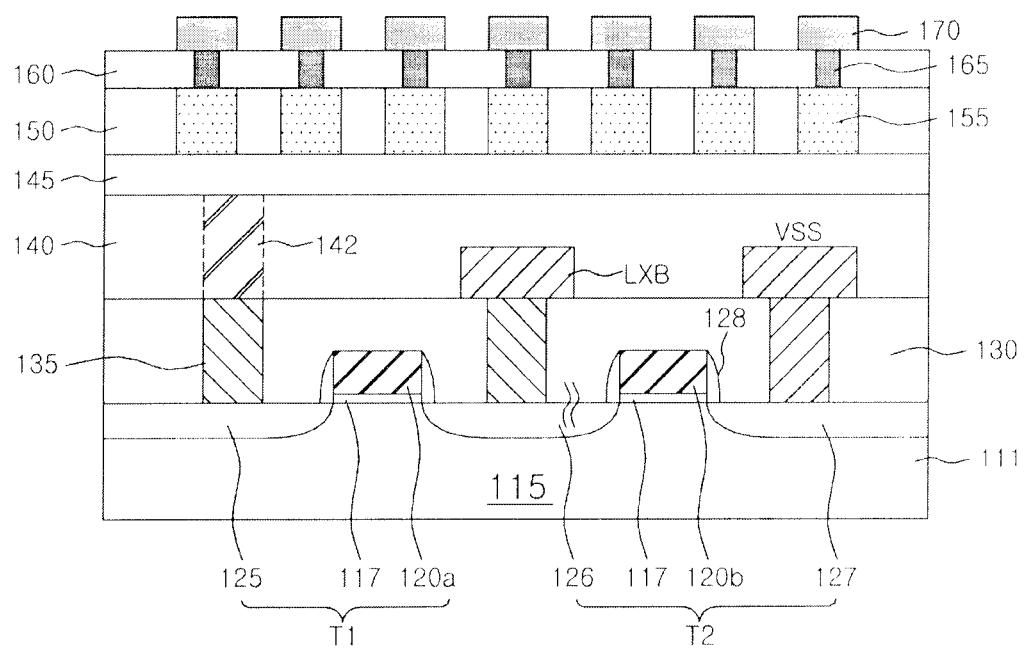
FIG. 4 is a sectional view of a phase change memory apparatus according to an exemplary embodiment of the invention.

FIG. 4 is a sectional view of the phase change memory apparatus according to the exemplary embodiment of the invention.

Referring to FIG. 4, the first gate electrode 120a and the second gate electrode 120b are formed on a semiconductor substrate 111, where the active area 115 is formed, while being spaced apart from each other by a certain interval. A step of forming the first gate electrode 120a and the second gate electrode 120b may include the steps of forming a gate dielectric layer 117, forming a gate conductive layer, and patterning the gate conductive layer and the gate dielectric layer 117. Insulation spacers 128 may be formed on the sidewalls of the first gate electrode 120a and the second gate electrode 120b.

After forming the insulation spacer 128, dopants, for example, n-type dopants, are implanted into the active area 115 at both sides of the first gate electrode 120a and the second gate electrode 120b to form the drains and sources 125, 126 and 127 of the first transistor T1 and the second transistor T2.

A first interlayer dielectric layer 130 is formed on the semiconductor substrate 111 including the first transistor T1 and the second transistor T2. The first interlayer dielectric layer 130 is etched to form contact holes (not shown) through which the drains and sources 125, 126 and 127 are exposed. The contact holes are filled with a conductive material to form contact plugs 135. The contact plugs 135 may correspond to the contact parts CT1 to CT3 in the plan view of FIG. 3.

The ground line Vss is formed on the contact plug 135 coupled to the source 127 of the second transistor T2, and the second local word line LXB is formed on the contact plug 135 coupled to the drain 126 of the second transistor T2. The ground line Vss and the second local word line LXB may be formed on planes different from each other in some cases.

A second interlayer dielectric layer 140 is formed on a resultant structure including the second local word line LXB and the ground line Vss. A word line 145 is formed on the second interlayer dielectric layer 140. The word line 145, for example, may be formed of a metal material in order to improve signal transmission characteristics. Reference numeral 142 indicated by a dotted line in the second interlayer dielectric layer 140 denotes a via plug which connects the contact plug 135 coupled to the drain 125 of the second transistor T1 to the word line 145.

A third interlayer dielectric layer 150 including a plurality of diodes 155 is formed on the word line 145. Since the diodes 155 are formed on the word line 145 provided in the form of a layer, the diodes 155 may have a Schottky diode structure including a polysilicon layer.

A fourth interlayer dielectric layer 160 including a plurality of heating electrodes 165 is formed on the third interlayer dielectric layer 150. The plurality of heating electrodes 165 are formed on the diodes 155, respectively.

Phase change patterns 170 serving as resistors R are formed on the heating electrodes 165, respectively.

In the phase change memory apparatus according to the exemplary embodiment as described above, the row control cells for controlling the word lines and the phase change memory cells are stacked on the cell array area. Consequently, the size of the phase change memory apparatus may decrease. Moreover, an area corresponding to the row control cells of the known art may be used for the cell array area, resulting in the improvement of the integration degree.

In addition, when a word line is driven, since global word lines and local word lines, which are directly and indirectly coupled to the word line, are simultaneously driven, the supply of a current becomes effective. Consequently, a voltage variation decreases, so that a probability of program and erase error decreases.

While certain embodiments have been described above, it will be understood to those skilled in the art that the embodiments described are by way of example only. Accordingly, the phase change memory apparatus described herein should not be limited based on the described embodiments. Rather, the phase change memory apparatus described herein should only be limited in light of the claims that follow when taken in conjunction with the above description and accompanying drawings.

What is claimed is:

1. A phase change memory apparatus comprising:
a plurality of row control cells; and
a plurality of phase change memory cells formed on the row control cells while being electrically connected to the row control cells,
wherein the plurality of row control cells and the plurality of phase change memory cells are vertically stacked in a cell array area.

2. The phase change memory apparatus according to claim 1, wherein the plurality of row control cells are configured to be controlled by global word lines.

3. The phase change memory apparatus according to claim 2, wherein each row control cell comprises:
a first transistor configured to be driven in response to a signal of the global word line, and coupled to the phase change memory cell; and
a second transistor configured to be driven in response to a signal of a first local word line, and coupled between the first transistor and a ground line.

4. The phase change memory apparatus according to claim 3, wherein the first transistor comprises:
a gate coupled to the global word line;
a drain coupled to a word line of the phase change memory cell; and
a source coupled to the second transistor.

5. The phase change memory apparatus according to claim 3, wherein the second transistor comprises:
a gate coupled to the first local word line;
a drain coupled to a source of the first transistor; and
a source coupled to the ground line.

6. The phase change memory apparatus according to claim 5, further comprising a second local word line formed in parallel to the first local word line, wherein the source of the first transistor and the drain of the second transistor are commonly coupled to the second local word line.

7. The phase change memory apparatus according to claim 6, wherein the second local word line has a signal with an opposite phase as compared with the first local word line.

8. The phase change memory apparatus according to claim 2, wherein the plurality of phase change memory cells are coupled to the global word lines, respectively.

9. The phase change memory apparatus according to claim 8, wherein each phase change memory cell comprises:
   a switching element coupled to a word line;
   a resistor coupled to the switching element; and
   a bit line coupled to the resistor.

10. The phase change memory apparatus according to claim 9, wherein the switching element includes a Schottky diode.

11. A phase change memory apparatus comprising:
    a global word line formed across a cell array area;
    a plurality of word lines configured to be controlled by the global word line;
    a plurality of row control cells coupled between the plurality of word lines and the global word line, wherein the plurality of row control cells are configured to control driving of the word lines; and
    a plurality of phase change memory cells coupled to the plurality of word lines, respectively,
    wherein the row control cells and the phase change memory cells are vertically stacked in the cell array area.

12. The phase change memory apparatus according to claim 11, further comprising:
    a plurality of first local word lines arranged while facing the global word line;
    a plurality of second local word lines formed in parallel to the first local word lines, wherein the plurality of second local word lines configured to transfer a signal with an opposite phase as compared with the first local word lines and; and
    a plurality of ground lines configured to apply a ground voltage to the row control cells.

13. The phase change memory apparatus according to claim 12, wherein each row control cell comprises:
    a first transistor configured to transfer a signal of a corresponding word line to a corresponding second local word line in response to a signal of the global word line; and
    a second transistor configured to transfer the signal, which is received from the first transistor, to the ground line in response to a signal of the first local word line.

14. The phase change memory apparatus according to claim 12, wherein the ground line is formed in parallel to the first local word lines and the second local word lines.

15. The phase change memory apparatus according to claim 11, wherein the global word line is provided in plurality on the cell array area, and global word lines in odd numbers and global word lines in even numbers are configured to correspond to each other while being separated from each other.

16. The phase change memory apparatus according to claim 11, wherein each phase change memory cell comprises:
    a Schottky diode coupled to the word line;
    a resistor coupled to the Schottky diode; and
    a bit line coupled to the resistor.

* * * * *